US006406930B2

United States Patent
Birkhahn et al.

(10) Patent No.: US 6,406,930 B2
(45) Date of Patent: Jun. 18, 2002

(54) FABRICATION OF VISIBLE LIGHT EMITTING DEVICE FORMED FROM WIDE BAND GAP SEMICONDUCTOR DOPED WITH A RARE EARTH ELEMENT

(75) Inventors: Ronald H. Birkhahn; Liang-Chiun Chao; Michael J. Garter, all of Cincinnati; James D. Scofield, Centerville; Andrew J. Steckl, Cincinnati, all of OH (US)

(73) Assignee: University of Cincinnati, Cincinnati, OH (US)

( * ) Notice: Subject to any disclaimer, the term of this patent is extended or adjusted under 35 U.S.C. 154(b) by 0 days.

(21) Appl. No.: 09/845,446

(22) Filed: Apr. 30, 2001

Related U.S. Application Data

(62) Division of application No. 09/299,186, filed on Apr. 23, 1999, now Pat. No. 6,255,669.

(51) Int. Cl.[7] ............................................. H01L 21/00
(52) U.S. Cl. ...................................................... 438/45
(58) Field of Search .............................. 438/22, 29, 45, 438/46, 47, 105, 507, 508, 509, 518, 522, 917, 918; 372/44, 46, 50

(56) References Cited

U.S. PATENT DOCUMENTS 5,045,498 A * 9/1991 Wang et al.
5,322,813 A * 6/1994 Beach
5,751,021 A   5/1998 Teraguchi

OTHER PUBLICATIONS

K. Gurumurugan, Hong Chen, G. R. Harp, W. M. Jadwisienczak and H. J. Lozykowski, Visible cathodoluminescence of Er–doped amorphous AlN thin films, Applied Physics Letters, vol. 74, No. 20, May 17, 1999.

D. M. Hansen, R. Zhang, N. R. Perkins, S. Safvi, L. Zhang, K. L. Bray and T. F. Kuech, Photoluminescence of erbium–implanted GaN and in situ–doped Gan:Er, Appl. Phys. Lett. vol. 72, No. 10, Mar. 9, 1998.

S. Kim, S. J. Rhee, D.A. Turnbull, E.E. Reuter, X. Li, J. J. Coleman, and S. G. Bishop, Observation of multiple Er3+ sites in Er–implanted GaN by site–selective photoluminescence excitation spectroscopy, Appl. Phys. Lett. 71 (2), Jul. 14, 1997.

S. Kim, S. J. Rhee, D. A. Turnbull, X. Li, J. J. Coleman, S. G. Bishop and P. R. Klein, Trap–mediated excitation of Er3+ photoluminescence in Er–implanted GaN, Appl. Phys. Lett. 71 (18), Nov. 3, 1997.

S. Kim. S. J. Rhee, D. A. Turnbull, X. Li, J. J. Coleman and S. G. Bishop, Site–Selective Photoluminenescence Excitation and Photoluminescence Spectroscopy of Er–Implanted Wurtzite GaN, Mat. Res. Soc. Symp. Proc. vol. 468, 1997 Materials Research Society.

H. J. Lozykowski and W. M. Jadwisienczak, Visible Cathodoluminescence of GaN doped with Dy, Er, and Tm, Applied Physics Letters, vol. 74, No. 8, Feb. 22, 1999.

(List continued on next page.)

*Primary Examiner*—Keith Christianson
(74) *Attorney, Agent, or Firm*—Wood, Herron & Evans, LLP

(57) ABSTRACT

A visible light emitting device includes a wide band gap semiconductor layer doped with one or more elements which emit light at various wavelengths based upon atomic transitions. The semiconductor preferably is GaN, InN, AlN, BN or alloys thereof doped with a lanthanide element such as Er, Pr or Tm. The light emission can be enhanced by annealing the WBGS.

11 Claims, 1 Drawing Sheet

OTHER PUBLICATIONS

J. D. Mackenzie, C. R. Abernathy, S. J. Pearton, S. M. Donovan, U. Hommerich, M. Thaik, X. Wu, F. Ren, R. G. Wilson and J. M. Zavada, Incorporation and Optical Activation of ErIN Group HI–N Materials Grown by Metalorganic Molecular Beam Epitaxy, Mat. Res. Soc. Symp. Proc. vol. 468, 1997 Materials Research Society.

J. D. MacKenzie, C. R. Abernathy, S. J. Pearton, U. Hommerich, X. Wu, R. N. Schwartz, R. G. Wilson and J. M. Zavada, Er doping of AlN during growth by metalorganic molecular beam epitaxy, Appl. Phys. Lett. 69 (14), Sep. 30, 1996.

J. D. MacKenzie, C. R. Abernathy, S. J. Pearton, U. Hommerich, X. Wu, R. N. Schwartz, R. G. Wilson and J. M. Zavada, Er doping of III–nitrides during growth by metalorganic molecular beam epitaxy, Journal of Crystal Growth 175/176 (1997) 84–88.

J. D. MacKenzie, C. R. Abernathy, S. J. Pearton, U. Hommerich, J. T. Seo, R. G. Wilson, and J. M. Zavada, Er doping of GaN during growth by metalorganic molecular beam epitaxy, Appl. Phys. Lett. vol. 72, No. 21, May 25, 1998.

C. H. Qiu, M. W. Leksono, J. I. Pankove, J. T. Torvik, R. J. Feuerstein and F. Namavar, Cathodoluminescence study of erbium and oxygen coimplanted gallium nitride thin films on sapphire substrates, Appl. Phys. Lett. 66 (5), Jan. 30, 1995.

Myo Thaik, U. Hommerich, R. N. Schwartz, R. G. Wilson and J. M. Zavada, Photoluminescence spectroscopy of erbium implanted gallium nitride, Appl. Phys. Lett. 71 (18), Nov. 3, 1997.

J. T. Torvik, R. J. Feuerstein, J. I. Pankove, C. H. Qiu and F. Namavar, Electroluminescence from erbium and oxygen coimplanted GaN, Appl. Phys. Lett. 69 (14), Sep. 30, 1996.

J. T. Torvik, C. H. Qiu, R. J. Feuerstein, J. I. Pankova and F. Namavar, Photo–, cathodo–, and electroluminescence from erbium and oxygen co–implanted GaN, J. Appl. Phys. 81 (9), May 1, 1997.

R. G. Wilson, R. N. Schwartz, C. R. Abernathy, S. J. Pearton, N. Newman, M. Rubin, T. Fu and J. M. Zavada, Photoluminescence from Er–implanted Ain and GaN, M. A. Prelas et al. (eds.), Wide Band Gap Electronic Materials, 431–435, 1995 Kluwer Academic Publishers, Printed in the Netherlands.

R. G. Wilson, R. N. Schwartz, C. R. Abernathy, S. J. Pearton, N. Newman, M. Rubin, T. Fu and J. M. Zavada, 1.54 um photoluminescence from Er–implanted GaN and AlN, Appl. Phys. Lett. 65 (8), Sep. 22, 1994.

X. Wu, U. Hommerich, J. D. Mackenzie, C. R. Abernathy, S. J. Pearton, R. N. Schwartz, R. G. Wilson and J. M. Zavada, Direct and indirect excitation of Er3+ ions in Er: AlN, Appl. Phys. Lett. 70 (16), Apr. 21, 1997.

A. R. Zanatta and L. A. O. Nunes, Green photoluminescence from Er–containing amorphous SiN thin films, Appl. Phys. Lett. vol. 72, No. 24, Jun. 15, 1998.

\* cited by examiner

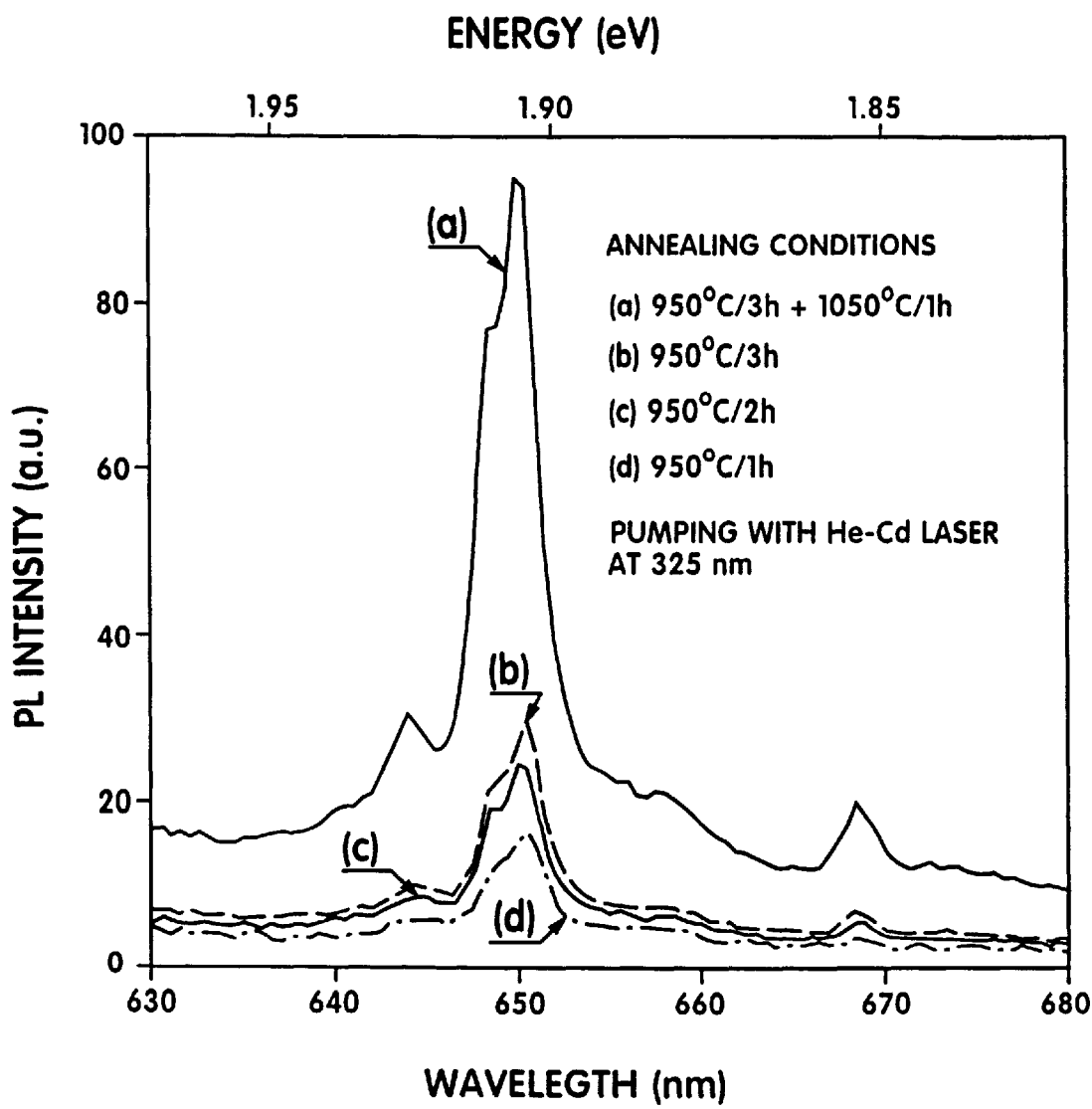

FABRICATION OF VISIBLE LIGHT EMITTING DEVICE FORMED FROM WIDE BAND GAP SEMICONDUCTOR DOPED WITH A RARE EARTH ELEMENT

This application is a divisional of application Ser. No. 09/299,186, filed on Apr. 23, 1999, now U.S. Pat. No. 6,255,669.

BACKGROUND OF THE INVENTION

Light emitting diodes (LED) and related light emitting devices are used in a vast number of applications. These can be used in most light emitting devices from simple panel lights to complex displays and lasers. Currently LEDs are used in the automotive industry, consumer instrumentation electronics, and many military applications. Different compounds are used to produce different wavelengths of light. For example, aluminum gallium arsenide is used for red LEDs, gallium aluminum phosphide for green, and GaN for blue. Light emitting materials formed from three different materials are often difficult to produce. Utilizing different LEDs together inherently requires allowing for different performance characteristics such as current and voltage requirements.

Wide band gap semiconductors (WBGS) doped with light emitting elements such as rare earth elements (RE) and other elements with partially filled inner shells are particularly attractive for LEDs because the emission efficiency appears to increase with band gap value, thus allowing room temperature operation without the need to introduce impurities. Wide band gap generally refers to a band gap of 2 eV or greater. Electroluminescence has been reported from several WBGS hosts including Er-doped gallium arsenide, gallium phosphide, GaN, ZnSe and SiC. Er-doped semiconductor light emitting diodes have been shown to emit in the infrared at about 1.5 microns. The infrared emission corresponds to transmissions between the lowest excited state ($^4I_{13/2}$) and the ground state ($^4I_{15/2}$) of the erbium atoms. The first Er-doped semiconductor light emitting diodes emitted IR light only at very low temperatures. However, recent advancements have permitted IR light emission at near room temperature. Although IR emitting Er-doped GaN has a great deal of utility in the communications industry, it previously has not been useful in a light emitting diode requiring visible emission.

SUMMARY OF THE INVENTION

The present invention is premised on the realization that wide band gap semiconductor substrates doped with elements with partially filled inner shells such as rare earth elements and transition metals can be formed and will emit in the visible and ultraviolet spectrum at a wide range of temperatures. The wide band gap semiconductor material are group III–V and IV materials including diamond, GaN, AlN, InN, BN and alloys thereof. These are doped with elements such as cerium, praseodymium, neodymium, promethium, samarium, europium, gadolinium, turbium, dysprosium, holmium, erbium, thulium, ytterbium, or lutetium or other elements with partially filled inner shells.

By proper formation of the wide band gap semiconductor material and proper introduction of the rare earth element, a light emitting diode can be formed which emits in the visible spectrum.

By selection of the appropriate dopant material, one can select the appropriate color. For example, in GaN, erbium will produce green whereas thulium will produce blue and praseodymium will produce red.

The objects and advantages of the present invention will be further appreciated in the light of the following detailed description and drawing in which:

BRIEF DESCRIPTION OF THE DRAWINGS

The FIGURE is a graph depicting the PL spectrum of Pr-implanted GaN films treated under different annealing conditions.

DETAILED DESCRIPTION

In order to form a light emitting devices according to the present invention, a wide band gap semiconductor material is formed on a substrate and doped with an effective amount of a rare earth element. The substrate itself can be any commonly used substrate such as silicon, silica, sapphire, metals, ceramics and insulators.

The WBGS is either a group III–V material or a group IV material such as diamond. In particular the WBGS material can include III–V semiconductors such as GaN, InN, AlN, BN as well as alloys of these.

Any production method which forms crystalline semiconductors can be used. Suitable techniques include molecular beam epitaxy (MBE), metal-organic chemical vapor deposition (MOCVD), chemical vapor deposition (CVD), plasma-enhanced chemical vapor deposition (PCVD), hydride vapor phase epitaxy (HVPE) and PECD. The desired thickness of a WBGS material will be formed on the substrate. For emission purposes the thickness of the WBGS is not critical. For practical reasons the thickness of the WBGS layer will be from about 0.2 to about 5 microns, with around 1 to 2 microns being preferred.

For the rare earth or transition metal to be strongly optically active in the wide band gap semiconductor, group III deficient growth conditioners should be utilized. This should permit the rare earth element to sit in an optically active site which promotes the higher energy or visible light emission.

The dopant material is one which has a partially filled inner shell with transition levels that can result in visible or U.V. emission. The dopant material can be a transition metal such as chromium or a rare earth element preferably from the lanthanide series and can be any of cerium, praseodymium, neodymium, promethium, samarium, europium, gadolinium, turbium, dysprosium, holmium, erbium, thulium, ytterbium, or lutetium. Typically RE dopants include thulium for a blue display, praseodymium for a red display, and erbium for a green display. These can be added to the WBGS by either in situ methods or by ion implantation. Generally the concentration can be relatively high, from less than about 0.1% up to about 10 atomic percent. The dopant concentration can be increased until the emission stops. Generally, the preferred concentration will be about 0.1 to about 10 atomic percent.

Further a full-color display can be created by utilizing three overlapping WBGS layers such as GaN each layer doped with different light emitting rare earth elements. Separate wiring could be used for each layer and each layer could be separated by transparent insulating layers. An array of side by side light emitting diodes could also be used to provide a full color display. A combination of dopants in the same WBGS can also be employed.

It may be desirable to anneal the WBGS. This tends to increase emission up to a point. Generally the WBGS is annealed in an argon or other inert environment at a temperature 800–1200° C. for 1–5 hours. More preferably the temperature will be from 850–1050° C., most preferably about 950° C.

The invention will be further appreciated in light of the following detailed example.

EXAMPLE 1

An erbium-doped GaN Schottky contact LED emitting visible light was formed by growing an erbium-doped GaN film in a Riber MBE-32 system on a two inch pSi substrate. Solid sources are employed to supply the gallium (7 N purity) and erbium (3 N) fluxes while an SVTA rf plasma source is used to generate atomic nitrogen. In this application, a GaN buffer layer was first deposited for 10 minutes at a temperature of 600° C. followed by GaN growth at a temperature of 750° C. The growth conditions were as follows: nitrogen flow rate 1.5 sccm at a plasma power of 400 Watts, gallium cell temperature of 922° C. (corresponding to a beam pressure of $8.2 \times 10^{-7}$ torr) and erbium cell temperature of 1100° C. The resulting GaN growth rate was about 0.8 microns/hour, and the erbium concentration was about $10^{20}/cm^3$. GaN films with a thickness of 2.5 microns were utilized.

To fabricate Schottky diodes on the GaN:erbium films, a semitransparent aluminum layer was deposited by sputtering. The aluminum film was patterned into a series of ring structures of varying areas utilizing a lift-off process. The aluminum rings serve as individual Schottky contacts while a large continuous aluminum surface was used as a common ground electrode. Electro luminescence characterization at ultraviolet and visible wavelengths was performed with a 0.3 m Acton research spectrometer fitted with a photo multiplier tube detector. All measurements were conducted at room temperature using dc applied bias voltage and current.

Applying reverse bias current to the order of 1 milliamp to a GaN:erbium Schottky LED, results in green emission visible with the naked eye under normal ambient lighting conditions. The emission spectrum consists of two strong and narrow lines at 537 and 558 nm which provides the green emission color. The two green lines have been identified as erbium transmissions from a $^2H_{11/2}$ and $^4S_{3/2}$ levels to the $^4I_{15/2}$ ground state. Photo luminescence characterization of the same GaN erbium films grown on silicon performed with a helium cadmium laser excitation source at a wavelength of 325 nanometers, corresponding to an energy greater than a GaN band gap, also produce green emissions from the same two transitions. Minor EL peaks were observed at 413 and at 666/672 nanometers.

The device had a threshold voltage for forward conduction of about 8.5 volts. At a forward voltage of 20 volts, a current flow of 350 milliamps is obtained. Under reverse bias of 20 volts, a current of about 30 microamps is measured. The capacitance voltage characteristic of the diode has a voltage intercept of about 11.5 volts and an effective GaN carrier concentration of approximately $10^{12}/cm^3$. The high diode forward resistance obtained in the current voltage characteristics of about 34 kilo-Ohms is probably due to the high resistivity of the GaN layer. The Schottky barrier height calculated from the capacitance voltage characteristics is approximately 9 volts, which was consistent with the threshold voltage. This large voltage probably indicates the presence of an insulating layer on the aluminum-GaN interface.

A linear relationship is maintained between the optical output and the bias current over a wide range of values. At current values smaller than 200 milliamps, the relationship is linear.

EXAMPLE 2

Er-doped GaN films are formed in a Riber MBE-32 system on c-axis sapphire substrates. Solid sources were employed to supply the Ga (7 N purity), Al (6 N), and Er (3 N) fluxes, while an SVTA Corp. rf plasma source was used to generate atomic nitrogen. The substrate was initially nitrided at 750° C. for 30 min at 400 W rf power with a $N_2$ flow rate of 1.5 sccm, corresponding to a chamber pressure of mid-$10^{-5}$ Torr. An AlN buffer layer was grown at 550° C. for 10 minutes with an Al beam pressure of $2.3 \times 10^{-8}$ Torr (cell temperature of 970° C.). Growth of the Er-doped GaN proceeded at 750° C. for 3 hours with a constant Ga beam pressure of $8.2 \times 10^{-7}$ Torr (cell temperature of 922° C.). The Er cell temperature was varied from 950 to 1100° C. The resulting GaN film thickness was nominally 2.4 $\mu$m giving a growth rate of 0.8 $\mu$m/h, as measured by scanning electron microscopy (SEM) and transmission optical spectroscopy. Photoluminescence (PL) characterization was performed with two excitation sources: (a) above the GaN band gap-HeCd laser at 325 nm (4–8 mW on the sample); (b) below the GaN band gap-Ar laser at 488 nm (25–30 mW). The PL signal was analyzed by a 0.3 m Acton Research spectrometer outfitted with a photomultiplier for ultraviolet (UV)-visible wavelengths (350–600 nm) and an InGaAs detector for infrared (1.5 $\mu$m) measurements. The PL signal of the Er-doped GaN samples was obtained over the 88–400 K temperature range. Above band gap excitation (He-Cd laser) resulted in light green emission form the Er-doped GaN films, visible with the naked eye.

Two major emission multiplets are observed in the green wavelength region with the strongest lines at 537 and 558 nm. A broad emission region is also present, peaking in the light blue at 480 nm. The yellow band typically observed at ~540–550 nm in GaN PL is absent.

EXAMPLE 3

Pr-doped GaN films were grown in a Riber MBE-32 system on 2" inch (50 mm) p-Si (111) substrates. Solid sources were employed to supply the Ga and Pr fluxes, while an SVTA rf-plasma source was used to generate atomic nitrogen. The growth of GaN:Pr followed the procedure previously discerned for GaN:Er. Substrate growth temperature was kept constant at 750° C. and the Pr cell temperature was 1200° C. We estimate, based on our work with GaN:Er, that this cell temperature results in a Pr concentration in the range of $10^{18}$–$10^{20}/cm^3$. PL characterization was performed with He—Cd and Ar laser excitation sources at wavelengths of 325 and 488 nm, respectively. The PL and EL signals were characterized with a 0.3-m Acton Research spectrometer outfitted with a photomultiplier tube (PMT) detector for UV-visible wavelengths and an InGaAs detector for IR. To measure EL characteristics, contacts were formed by sputtering a transparent and conducting indium-tin-oxide (ITO) layer onto the GaN:Pr structure.

He—Cd PL excitation (as 325 nm) resulted in an intense, deep red emission from the Pr-doped GaN, visible with the naked eye. The room temperature PL at visible wavelengths is shown in FIG. 1 for a 1.5 $\mu$m thick GaN film grown on Si. The spectrum indicates a very strong emission line in the red region at 650 nm, with a weak secondary peak at 668 nm.

EXAMPLE 4

Praseodymium implantation was performed in a Micro-Beam 150 FIB system utilizing a Pr-Pt liquid alloy ion source (LAIS). The Pr-Pt alloy was prepared by mixing praseodymium and platinum at an atomic percent ratio of 87:13. This produces an eutectic alloy with a melting point of 718° C. Mass spectrum analysis showed that a $Pr^{2+}$ target current of ~200 pA was produced, representing 75% of the total target current. A $Pt^+$ target current of ~50 pA was also observed.

The $Pr^{2+}$ beam was accelerated to high voltage and implantation was carried out at room temperature on GaN films grown by MBE, HVPE, and metalorganic chemical vapor deposition (MOCVD). After FIB implantation, the samples were annealed under different conditions. PL measurements were performed at room temperature by pumping the samples with a CW He—Cd laser at 325 nm. The He—Cd laser was focused on the sample surface, where the laser power and beam diameter were 12 mW and 200 $\mu$m, respectively. The PL signal was collected by a lock-in amplifier and characterized with a 0.3-m Acton Research spectrometer outfitted with a photomultiplier tube (PMT) detector for UV-visible wavelengths and an InGaAs detector cooled to 0° C. for IR. A grating of 1200 grooves/mm with a resolution of 1.67 nm/mm was used for UV-visible wavelengths.

The FIGURE shows the annealing effect on PL intensity for a Pr-implanted GaN film grown on sapphire by MBE. The implanted pattern is a 136 $\mu$m×136 $\mu$m square. The implantation was performed using a 300 keV $Pr^{2+}$ beam with a target current of 200 pA. The pixel exposure time was 1.14 ms and the pixel size was 0.265 $\mu$m×0.265 $\mu$m. This results in a dose of ~1×10$^{15}$ atoms/cm$^2$. Simulation of these implantation conditions using TRIM'95[9] calculates a projected range of ~60 nm and a peak concentration of ~1.7×10$^{20}$ atoms/cm$^3$. The sample was first annealed at 950° C. for one hour in flowing argon. After this first anneal, the 650 nm peak became discernible. The sample was subsequently annealed at 950° C. for another two hours, leading to an increase in the peak intensity at 650 nm. The third anneal was carried out at 1050° C. for one hour resulting in the PL intensity at 650 nm increasing by a factor of 4. In spite of the small implanted pattern size (136 $\mu$m×136 $\mu$m), the emitted red light intensity was strong enough to be easily seen with the naked eye. Annealing for a fourth and final time at 1050° C. resulted in a reduced PL intensity. This suggests that a one-step annealing at 1050° C. is adequate to optically activate the $Pr^{3+}$ ions implanted in the GaN film. Similar PL spectra were observed from Pr-doped sulfide glasses.

EXAMPLE 5

A GaN region was also patterned by Pr FIB implantation. The implantation was performed using a 290 keV $Pr^{2+}$ beam for a dose of ~4.7×10$^{14}$ atoms/cm$^2$. After FIB implantation, the sample was annealed at 1050° C. for one hour in Ar. Under UV excitation from the He—Cd laser, the implanted region emits red light, while unimplanted surrounding area shows the yellow band emission of GaN.

EXAMPLE 6

Pr implantation was also performed on GaN films grown by HVPE and MOCVD. Regions consisting of 141 $\mu$m×141 $\mu$m squares were implanted on both samples with a dose of 1×10$^{15}$ atoms/cm$^2$ and a beam energy of 290 keV. Both samples as well as a Pr-implanted MBE sample (dose=4.7×10$^{14}$ atoms/cm$^2$) show strong red emission at 650 nm, which corresponds to the $^3P_0$–$^3F_2$ transition of $Pr^{3+}$. All three samples show similar band edge emission at around 365 nm.

EXAMPLE 7

Pr-implanted GaN film grown by MBE on sapphire was formed. After FIB implantation with a dose of 4.7×10$^{14}$ Pr/cm$^2$ the sample was annealed at 1050° C. for one hour in Ar. The Pr concentration of the in-situ doped GaN film is estimated to be at the range of 10$^{18}$–10$^2$ atoms/cm$^3$. In general, the PL intensity of the in-situ Pr-doped GaN sample is stronger (~5×) than that in the FIB-implanted sample, which is expected from the much larger Pr-doped volume which is excited in the former case. For the samples, the full width at half maximum (FWHM) of the 648 and 650 nm lines are ~1.2 nm, which corresponds to 3.6 meV.

Thus the present invention can be utilized to produce light emitting devices from wide band gap semiconductor material utilizing rare earth dopants. The particular wavelength of emission is certainly characteristic of the added component. Further, it is possible to combine the rare earth implants to develop unique light emitting devices. Thus the present invention lends itself to a wide variety of different light emitting devices, extending from the infrared range down through the ultraviolet range.

This has been a description of the present invention along with a preferred method of practicing the invention.

However, the invention itself should be defined only by the appended claim, wherein we claim:

1. A method of forming a light emitting device which will emit in the visible to UV spectrum at room temperature comprising forming a semiconductor material wherein said material is selected from a group consisting of group III–V and IV wide band gap semiconductors and adding to said semiconductor a light emitting element in an amount effective to provide visible light emission wherein said light emitting element has a partially filled transition level effective to emit light in the visible to UV spectrum.

2. The method claimed in claim 1 wherein said light emitting element is combined in situ with as said semiconductor is formed.

3. The method claimed in claim 1 wherein said light emitting element is implanted in said semiconductor material.

4. The method claimed in claim 1 wherein said semiconductor material is annealed at a temperature and time effective to enhance the visible emission of said device.

5. The method claimed in claim 1 wherein said light emitting element is chromium.

6. The method claimed in claim 3 wherein said semiconductor material is annealed after said light emitting element is combined with said semiconductor material.

7. The method claimed in claim 1 wherein said light emitting element is selected from the group consisting of cerium, praseodymium, neodymium, promethium, samarium, europium, gadolinium, terbium, dysprosium, holmium, erbium, thulium, ytterbium, and lutetium and mixtures thereof.

8. The method claimed in claim 7 wherein said light emitting element is selected from the group consisting of thulium, praseodymium, and erbium.

9. The method claimed in claim 1 wherein said semiconductor material is GaN.

10. The method claimed in claim 7 wherein at least two different rare earth elements are combined with said semiconductor material.

11. The method claimed in claim 7 wherein three separate rare earth elements are combined with said semiconductor material.

* * * * *

UNITED STATES PATENT AND TRADEMARK OFFICE
CERTIFICATE OF CORRECTION

PATENT NO. : 6,406,930 B2
DATED : June 18, 2002
INVENTOR(S) : Steckl et al.

It is certified that error appears in the above-identified patent and that said Letters Patent is hereby corrected as shown below:

Column 1,
Line 5, insert the following statement -- Statement Regarding Federally Sponsored Research or Development. The United States Government has a paid up license in this invention and the right in limited circumstances to require the patent owner to license others on reasonable terms as provided by the terms of Grant Numbers DAAH04-95-1-0626, DAAH04-93-G-0327 and DAAH04-95-1-0347 awarded by the United States Army Research Office. --
Line 54, reads "AIN" should be -- AlN --.

Column 2,
Line 18, reads "AIN" should be -- AlN --.

Column 4,
Line 6, reads "AIN" should be -- AlN --.
Line 24, reads "resulted in light green emission form the Er-doped GaN films," should read -- resulted in light green emission from the Er-doped GaN films Column 6,
Line 3, reads "$10^{18}$-$10^{2}$", should read -- $10^{18}$-$10^{20}$ --.

Signed and Sealed this

Twenty-first Day of January, 2003

JAMES E. ROGAN
*Director of the United States Patent and Trademark Office*